(12) United States Patent
Liu et al.

(10) Patent No.: US 12,272,593 B2
(45) Date of Patent: Apr. 8, 2025

(54) CYCLICAL DEPOSITION METHOD AND APPARATUS FOR FILLING A RECESS FORMED WITHIN A SUBSTRATE SURFACE

(71) Applicant: ASM IP Holding B.V., Almere (NL)

(72) Inventors: Zecheng Liu, Helsinki (FI); Viljami Pore, Helsinki (FI)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 18/380,981

(22) Filed: Oct. 17, 2023

(65) Prior Publication Data

US 2024/0047264 A1 Feb. 8, 2024

Related U.S. Application Data

(60) Division of application No. 17/741,562, filed on May 11, 2022, now Pat. No. 11,798,834, which is a continuation of application No. 16/792,544, filed on Feb. 17, 2020, now Pat. No. 11,342,216.

(60) Provisional application No. 62/808,249, filed on Feb. 20, 2019.

(51) Int. Cl.
*H01L 21/762* (2006.01)
*C23C 16/04* (2006.01)
*C23C 16/455* (2006.01)
*H01L 21/02* (2006.01)

(52) U.S. Cl.
CPC ........ *H01L 21/76224* (2013.01); *C23C 16/04* (2013.01); *C23C 16/45536* (2013.01); *C23C 16/45544* (2013.01); *H01L 21/02274* (2013.01); *H01L 21/0228* (2013.01)

(58) Field of Classification Search
CPC ......... H01L 21/76224; H01L 21/02274; H01L 21/0228; H01L 21/02164; H01L 21/02219; H01L 21/02315; C23C 16/04; C23C 16/45536; C23C 16/45544; C23C 16/45542; C23C 16/045; C23C 16/50; C23C 16/45527; C23C 16/45534
See application file for complete search history.

(56) References Cited

U.S. PATENT DOCUMENTS

| | | | |
|---|---|---|---|
| 10,593,541 B2 | 3/2020 | Kato | |
| 11,028,477 B2 | 6/2021 | Sally et al. | |
| 2009/0203197 A1 | 8/2009 | Hanawa et al. | |
| 2014/0030889 A1* | 1/2014 | Chen | C23C 16/18 257/E21.584 |
| 2017/0011960 A1* | 1/2017 | Ko | H01L 21/76843 |

* cited by examiner

*Primary Examiner* — Evan G Clinton
(74) *Attorney, Agent, or Firm* — Snell & Wilmer L.L.P.

(57) ABSTRACT

There is provided a method of filling one or more recesses by providing the substrate in a reaction chamber; introducing a first reactant, to form first active species, for a first pulse time to the substrate; introducing a second reactant for a second pulse time to the substrate; and introducing a third reactant, to form second active species, for a third pulse time to the substrate. An apparatus for filling a recess is also disclosed and a structure formed using the method and/or apparatus is disclosed.

3 Claims, 3 Drawing Sheets

CYCLICAL DEPOSITION METHOD AND APPARATUS FOR FILLING A RECESS FORMED WITHIN A SUBSTRATE SURFACE

CROSS-REFERENCE TO RELATED APPLICATIONS

This application is a divisional of, and claims priority to, U.S. patent application Ser. No. 17/741,562 filed May 11, 2022 and titled CYCLICAL DEPOSITION METHOD AND APPARATUS FOR FILLING A RECESS FORMED WITHIN A SUBSTRATE SURFACE; which is a continuation of U.S. patent application Ser. No. 16/792,544 filed Feb. 17, 2020 and titled CYCLICAL DEPOSITION METHOD AND APPARATUS FOR FILLING A RECESS FORMED WITHIN A SUBSTRATE SURFACE (now U.S. Pat. No. 11,342,216 issued on May 24, 2022); which claims the benefit of U.S. Provisional Patent Application Ser. No. 62/808,249 filed Feb. 20, 2019 and titled CYCLICAL DEPOSITION METHOD AND APPARATUS FOR FILLING A RECESS FORMED WITHIN A SUBSTRATE SURFACE, the disclosures of which are hereby incorporated by reference in their entirety.

FIELD OF DISCLOSURE

The present disclosure generally relates to methods and apparatus for manufacturing electronic devices. More particularly, the disclosure relates to methods and apparatus for filling one or more recesses formed within a surface of a substrate during the manufacturing of electronic devices and to structures formed using the methods and/or apparatus.

BACKGROUND

During manufacturing of electronic devices, such as an integrated circuit (IC), recesses, such as gaps, trenches, or areas between fins, can be created on a surface of a substrate. Filling the recesses can take a variety of forms, depending upon the specific application.

A typical recess filling process may be subjected to drawbacks, including void formation in the recess. Voids may be formed when the filling material forms a constriction near a top of the recess before the recess is completely filled. Such voids may compromise device isolation of the devices on the IC as well as the overall structural integrity of the IC. Unfortunately, preventing void formation during recess fill may place size constraints on the recesses, which may limit device packing density of the devices.

Void formation may be mitigated by decreasing recess depth and/or tapering recess sidewalls, so that the openings of the recess are wider at the top than at the bottom of the recess. A trade off in decreasing the recess depth may be reducing the effectiveness of the device isolation, while the larger top openings of recesses with tapering sidewalls may use up additional IC real estate. Such problems can become increasingly problematic when attempting to reduce device dimensions. Accordingly, improved methods and apparatus for filling a recess are desired.

SUMMARY

Various embodiments of the present disclosure relate to methods of filling a recess, such as a trench or an area between fins, on a surface of a substrate. While the ways in which various embodiments of the present disclosure address drawbacks of prior methods are discussed in more detail below, in general, various embodiments of the disclosure provide improved methods and apparatus suitable for seamlessly filling high aspect ratio recesses with desired material, such as dielectric material. As set forth in more detail below, exemplary methods can initially inhibit deposition of material at a top area of a recess, relative to a bottom area of the recess, to facilitate seamless filling of the recess. Further, examples of the disclosure allow for low-temperature deposition of material, which can mitigate oxidation of underlying and/or surrounding material. Additionally, high-quality deposited material can be formed within the recess, without post-treatment annealing of the deposited material that is otherwise often performed to improve the quality of recess fill material.

In accordance with at least one embodiment of the disclosure, a method of filling a recess formed within a substrate surface includes the steps of: providing the substrate in a reaction chamber; introducing a first reactant, to form first active species, for a first pulse time to the substrate at a first pressure, wherein the first active species modify a first portion (e.g., top) of a surface of the recess; introducing a second reactant for a second pulse time to the substrate, wherein the second reactant reacts with a second portion (e.g., bottom) of the surface of the recess to form chemisorbed material on the second portion; and introducing a third reactant, to form second active species, for a third pulse time to the substrate at a second pressure, wherein the second active species react with the chemisorbed material to form deposited material. In accordance with exemplary aspects, the first pulse time is greater than the third pulse time. In accordance with further aspects, the second pressure is higher than the first pressure. In accordance with further examples, an anisotropic plasma can be formed during the step of introducing a first reactant. And, in accordance with yet further examples, an isotropic plasma can be formed during the step of introducing a third reactant. In accordance with yet further examples, a substrate temperature (or substrate support temperature) can be relatively low (e.g., below 450° C., between about 75° C. and about 450° C. or between about 250° C. and about 350° C.) to mitigate any oxidation of the substrate and/or recess surfaces.

According to a further embodiment, there is provided a semiconductor processing apparatus to provide, for example, an improved or at least an alternative recess filling method, such as a method described herein. In accordance with at least one embodiment of the disclosure, a semiconductor processing apparatus includes one or more reaction chambers for accommodating a substrate comprising a surface having a recess formed therein; a first source for a first reactant in gas communication via a first valve with one of the reaction chambers; a second source for a second reactant in gas communication via a second valve with one of the reaction chambers; a third source for a third reactant in gas communication via a third valve with one of the reaction chambers; and a controller operably connected to the first, second, and third gas valves and configured and programmed to control: introducing the first reactant for a first pulse time to the substrate at a first pressure to provide, for example, an anisotropic plasma to a first portion of a surface of the recess (or to the surface of the recess); introducing the second reactant for a second pulse time to the substrate; and introducing the third reactant for a third pulse time to the substrate at a second pressure to provide, for example, an isotropic plasma to a second portion of a surface of the recess (or to the surface of the recess). In accordance with exemplary aspects, the first pulse time is greater than the third pulse time. In accordance with further aspects, the second pressure is higher than the first pressure. In accordance with yet further examples, the controller or another controller can be configured to control a substrate temperature (or substrate support temperature) between about 75° C. and about 450° C. or between about 250° C. and about 350° C.). At least one of the one or more reaction chambers can include a direct plasma atomic layer deposition reaction chamber. Additionally or alternatively, the semiconductor processing apparatus can include a remote plasma unit fluidly coupled to at least one of the one or more reaction chambers.

In accordance with yet further exemplary embodiments of the disclosure, a semiconductor structure can be formed using a method and/or an apparatus as described herein.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein. These and other embodiments will become readily apparent to those skilled in the art from the following detailed description of certain embodiments having reference to the figures, the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
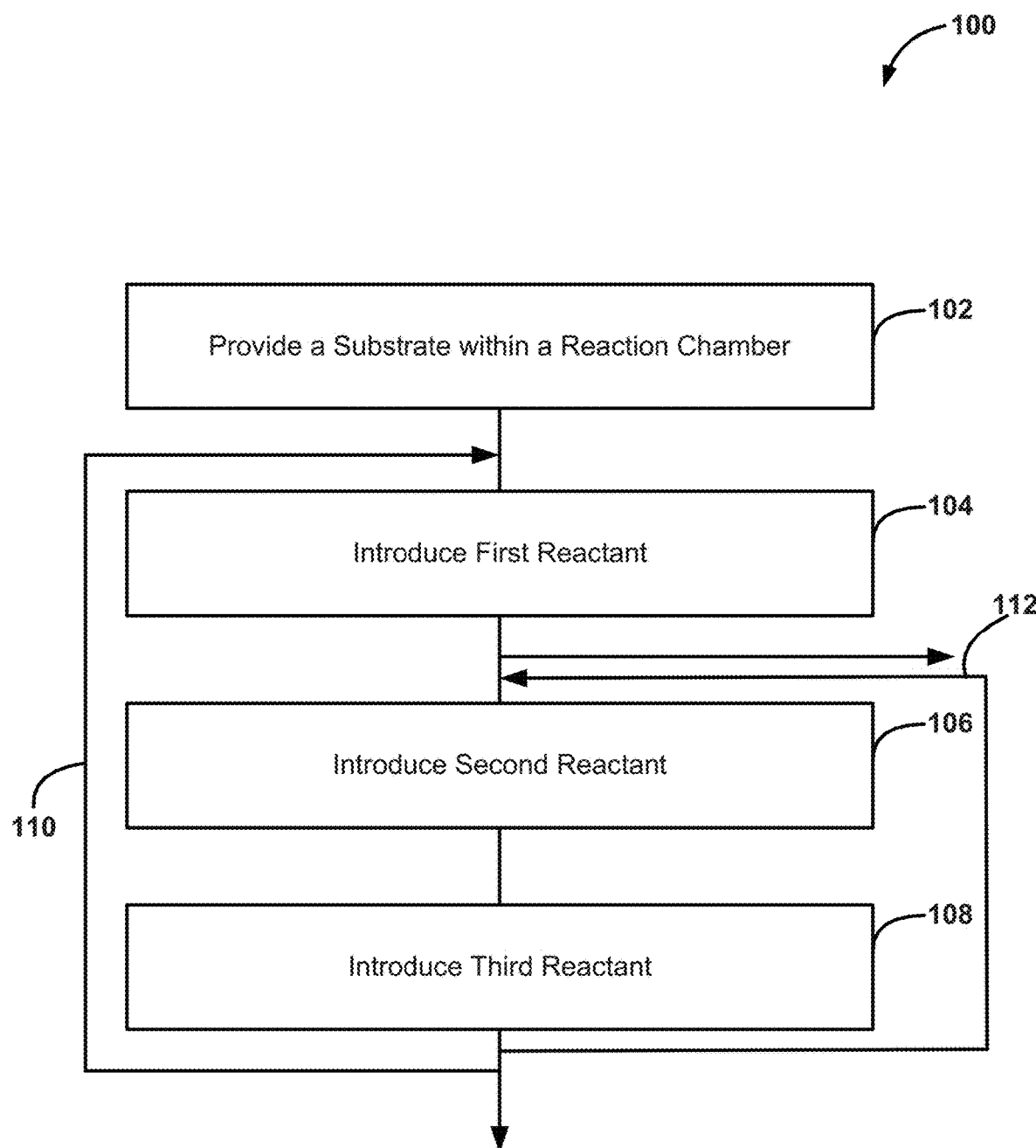
FIG. 1 illustrates a method for filling a recess in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

Exemplary embodiments of the disclosure can be used to fill recesses, such as trenches, vias, and/or areas between fins on a surface of a substrate. By way of particular example, exemplary methods can be used for shallow trench isolation (STI) applications in the manufacture of electronic devices, such as memory and/or logic circuits.

Using conventional techniques, such as conventional plasma-enhanced chemical vapor deposition to fill recesses, can result in poor film quality (e.g., a relatively high (e.g., wet) etch rate), seam formation, and/or void formation. Seams and voids that form within deposited material within the recess can be problematic in several regards. For example, seams and/or voids formed within material deposited in recesses that are used for STI can result in unwanted parasitic current. Further, the voids and seams can cause problems during subsequent processes, such as chemical mechanical polishing and etching.

Recently, plasma-enhanced atomic layer deposition (PEALD) techniques have been developed to more conformally deposit material into a recess. However, techniques to fill recesses using PEALD, particularly techniques to provide seamless filling of high aspect ratio (e.g., aspect ratios greater than 15 or even 30) recesses with high-quality dielectric material, such as silicon oxide that exhibits a relatively low (e.g., less than about 4.5 nm/min) wet etch rate (e.g., a wet etch rate ratio of about 1.8) in 0.5% diluted HF solution has, to date, been challenging. Further, filling reentrant recesses (recesses with an opening diameter that may be smaller than a diameter of the recess at the bottom area of the recess) has proven to be difficult using typical PEALD techniques.

Exemplary methods and apparatus described herein can be used to deposit material, such as dielectric material, in a high-aspect ratio recess on a surface of a substrate. As discussed in greater detail below, the material can be deposited in a manner that mitigates or prevents seam and/or void formation in the deposited material. Further, the methods and apparatus can be used to deposit high-quality material, without a need for further post treatment, such as annealing, of the material.

As used herein, the term substrate may refer to any underlying material or materials that may be used to form, or upon which, a device, a circuit, or a film may be formed. A substrate can include a bulk material, such as silicon (e.g., single-crystal silicon) and can include one or more layers overlying the bulk material. Further, the substrate can include various topologies, such as recesses, lines, and the like formed within or on at least a portion of a layer of the substrate.

As used herein, the term atomic layer deposition (ALD) may refer to a vapor deposition process in which deposition cycles, typically a plurality of consecutive deposition cycles, are conducted in a process chamber. Generally, during each cycle, a precursor is chemisorbed to a deposition surface (e.g., a substrate surface that can include a previously deposited material from a previous ALD cycle or other material), forming about a monolayer or sub-monolayer of material that does not readily react with additional precursor (i.e., a self-limiting reaction). Thereafter, in some cases, a reactant (e.g., another precursor or reaction gas) may subsequently be introduced into the process chamber for use in converting the chemisorbed precursor to the desired material on the deposition surface. The reactant can be capable of further reaction with the precursor. Further, purging steps can also be utilized during each cycle to remove excess precursor from the process chamber and/or remove excess reactant and/or reaction byproducts from the process chamber after conversion of the chemisorbed precursor. Further, the term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor(s)/reactive gas(es), and purge (e.g., inert carrier) gas(es). The terms reactant and precursor can be used interchangeably.

Turning now to the figures, FIG. 1 illustrates a method 100 in accordance with at least one embodiment of the disclosure. Method 100 can be used to, for example, fill one or more recesses, sometimes referred to as gaps or features, created during manufacturing of a structure—e.g., structures formed during the manufacture of electronic devices. An opening at a top of a recess may be, for example, less than 100 or 40 or even 20 nm wide; a depth of the recess may be more than 40, 100, 200, 500, 2000 or even 5000 nm. An aspect ratio of the recesses can range from, for example, about 5:1 to about 30:1 or even to about 250:1.

Method 100 can be a cyclic deposition process, such as an ALD process. In the illustrated example, method 100 includes the steps of providing the substrate in a reaction chamber (step 102), introducing a first reactant (step 104), introducing a second reactant (step 106), and introducing a third reactant (step 108).

Providing the substrate in a reaction chamber step 102 includes providing a substrate to a reaction chamber for processing in accordance with method 100. By way of example, a substrate can include a layer of or a layer including silicon and having at least one recess formed therein.

During step 102, the substrate can be brought to a desired temperature for subsequent processing using, for example, a substrate heater and/or radiative or other heaters. A temperature during steps 102-108 can be less than 450° C. or range from about 75° C. to about 450° C. or about 250° C. to about 350° C. A pressure within the reaction chamber during steps 102-108 can be from about 2 Torr to about 20 Torr or about 3 Torr to about 9 Torr. As described in more detail below, a pressure within the reaction chamber during steps 104-108 can be changed (e.g., to manipulate plasma conditions) to facilitate seamless fill of one or more recesses within the surface of the substrate. However, in accordance with other examples of the disclosure, the pressure within the reaction chamber can remain substantially constant (e.g., within about 10 percent) during steps 104-108.

During step 104, the first reactant is introduced into the reaction chamber. The first reactant can be used to form a first active species that is supplied to a surface of the substrate for a first pulse time. The first active species can be used to modify a first portion of a surface of the recess. For example, the first active species can be used to passivate otherwise active/reactive sites on the first portion (e.g., a top area) of the surface of the recess, while not passivating—or passivating to a lesser extent active sites on a second portion (e.g., a bottom area) of the surface of the recess. As a result, a growth per cycle of deposited material on the first portion of a surface of the recess can be reduced, compared to a growth per cycle of deposited material on the second portion of a surface of the recess.

An operating pressure within the reaction chamber during step 104 may be desirably controlled to provide an anisotropic plasma to the surface of the recess. For example, a pressure within the reaction chamber can be about 2 to about 8 or about 3 to about 6 Torr. The anisotropic plasma conditions allow for greater passivation of reactive sites on the first portion of a surface of the recess relative to the second portion of a surface of the recess. A plasma power during step 104 can range from about 100 W to about 1 kW or about 200 W to about 400 W. The plasma can be formed using a direct or remote plasma. A pulse time of and/or an on time for the plasma during step 104 can range from about 3 seconds to about 20 seconds or about 8 seconds to about 15 seconds.

In accordance with examples of the disclosure, the first reactant can comprise nitrogen or a gas comprising nitrogen. In accordance with further examples, the first reactant can include one or more of nitrogen, He, Ne, Ar, Kr, Xe, $C_xN_yH_z$ (where x, y, and z are integers), $NH_3$ and $N_2H_4$.

Step 104 can include a purge substep. During the purge substep, excess reactant(s) and reaction byproducts, if any, may be removed from the reaction space/substrate surface, for example, by a purging gas pulse and/or vacuum generated by a pumping system. The purging gas can be any inert gas, such as, without limitation, argon (Ar), nitrogen ($N_2$) and/or helium (He). A phase is generally considered to immediately follow another phase if a purge (i.e., purging gas pulse) or other reactant removal step intervenes. A flowrate of a purge gas during the purge substep can range from about 500 sccm to about 4500 sccm or about 2000 sccm to about 4000 sccm. A time of the gas flow during the purge substep can range from about 0.1 seconds to about 2 seconds or about 0.2 seconds to about 1 seconds.

During step 106, the second reactant is introduced into the reaction chamber. The second reactant can react with the second portion of the surface of the recess to form chemisorbed material on the second portion of the surface of the recess. As noted above, chemisorption of the second reactant can be inhibited on the first portion of the surface of the recess using step 104.

A pressure within a reaction chamber during step 106 can be the same or similar to the pressure within the reaction chamber during any of steps 102, 104, and 108. By way of example, the pressure within the reaction chamber during step 106 can be about 2 Torr to about 20 Torr or about 3 Torr to about 10 Torr. A pulse time of step 106 can range from about 0.1 seconds to about 5 seconds or about 0.5 seconds to about 4 seconds.

The second reactant can include, for example, silicon. By way of examples, the second reactant can include one or more of silane amines, siloxane amines and silazane amines. By way of particular example, the second reactant can be or include a silanediamine, such as N,N,N',N'-tetraethyl silanediamine, such as sold by Air Liquide (Paris, France) under the name ALOHA™ SAM.24.

Similar to step 104, step 106 can include a purge substep. During a purge substep, excess reactant(s) and reaction byproducts, if any, can be removed from the substrate surface, for example, as described above. The purging substep under step 106 may be particularly desirable to mitigate any unwanted CVD reactions that might otherwise occur with the introduction of the third reactant during step 108. A flowrate of a purge gas during the purge substep can range from about 500 sccm to about 4500 sccm or about 2000 sccm to about 4000 sccm. A time of the gas flow during the purge substep can range from about 0.5 seconds to about 5 seconds or from about 1 seconds to about 3 seconds.

During step 108, the third reactant is introduced into the reaction chamber. During this step, a second active species can be generated for a third pulse time to the substrate at a second pressure. The second active species can react with the chemisorbed material to form deposited material. The second active species may be desirably formed using isotropic plasma conditions to facilitate the second active species efficiently reacting with the chemisorbed material. The second active species may, for example, react with the chemisorbed material and remove ligands from the chemisorbed material to thereby form deposited material.

Because less chemisorbed material is deposited on the first portion of the surface of the recess relative to the second portion of the surface of the recess, the deposited material can preferentially deposit on the second portion of the surface of the recess relative to the first portion of the surface of the recess.

A pressure within the reaction chamber during step 108 may be the same or higher than the pressure within the reaction chamber during step 104. A higher pressure during step 108 may facilitate formation of the isotropic plasma. Further, at higher pressure, energetic positive ions bombarding to the substrate may be weakened, such that any charge buildup, which might otherwise contribute to seam formation, can be reduced or minimized. Regarding the film quality, higher pressure in step 108 may result in relatively poor quality film. But, step 104 can overcome this, resulting in higher quality film. When method 100 includes operational steps at different pressures, it may be desirable to use a ballast pressure controller to control the pressure within the reaction chamber. Conversely, if the pressure within the reaction chamber remains about the same (e.g., within about 10 percent), a throttle valve may be used to control the pressure within the reaction chamber.

An operating pressure within the reaction chamber during step 108 may be desirably controlled to provide an isotropic plasma to the surface of the recess. For example, a pressure within the reaction chamber can be about 3 to about 20 or about 4 to about 10 Torr. A plasma power during step 108 can range from about 50 W to about 1 kW or about 100 W to about 500 W. The plasma can be formed using a direct or remote plasma. A pulse time of and/or an on time for the plasma during step 108 can range from about 0.2 seconds to about 3 seconds or about 0.5 seconds to about 2 seconds. The pulse time of step 108 can be less than the pulse time of step 104.

In accordance with examples of the disclosure, the third reactant can comprise an oxidant or a gas comprising oxygen. In accordance with further examples, the third reactant can include one or more of water, hydrogen peroxide, molecular oxygen and ozone.

Step 108 can include a purge substep. A flowrate of a purge gas during the purge substep can range from about 500 sccm to about 4500 sccm or about 2000 sccm to about 4000 sccm. A time of the gas flow during the purge substep can range from about 0.1 seconds to about 2 seconds or about 0.2 seconds to about 1 seconds.

Method 100 can optionally include a loop 112 that includes repeating steps 106 and 108, which can be repeated after step 104. For example, method 100 can include a step 104 followed by repeating the combination of steps 106 and 108 two or more—e.g., three or more—times.

Figure 2:
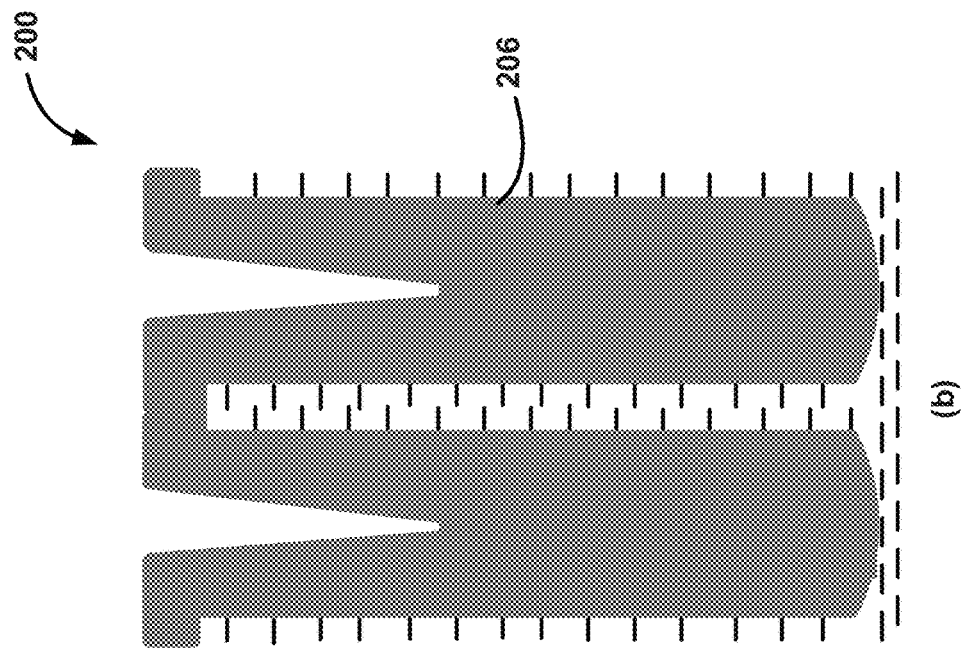
FIG. 2 illustrates a recess being filled in accordance with at least one embodiment of the disclosure.
Figure 2:
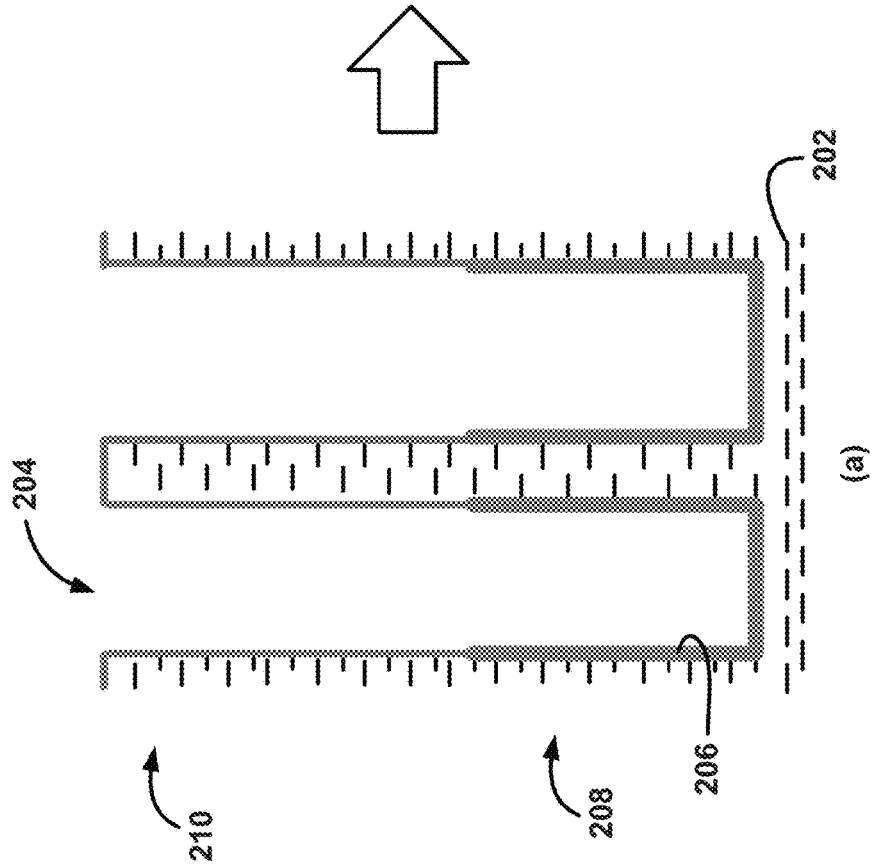

FIGS. 2(a) and 2(b) illustrate a structure 200 formed in accordance with exemplary methods (e.g., method 100) and/or using an apparatus as described herein. Structure 200 includes a substrate 202, a recess 204 formed therein, and deposited material 206. When recess 204 is filled with deposited material 206, deposited material 206 can be voidless and/or seamless, such that no visible void or seam is observed in deposited material 206. By way of example, deposited material 206 can include dielectric or insulating material, such as silicon oxide ($SiO_x$). Additionally, deposited material 206, for example, $SiO_x$, can be of relatively high quality—e.g., having a wet etch rate in 0.5% diluted HF solution of lower than 10, 8, 6, or even 4 nm/min.

As illustrated in FIG. 2(a), initially deposition of deposited material 206 may be greater in a lower area or region 208 of recess 204 relative to an upper area or region of recess 204. This allows recess 204 to fill from bottom area 208 substantially upwards to fill recess 204 in a seamless manner, as illustrated in FIG. 2(b).

Figure 3A:
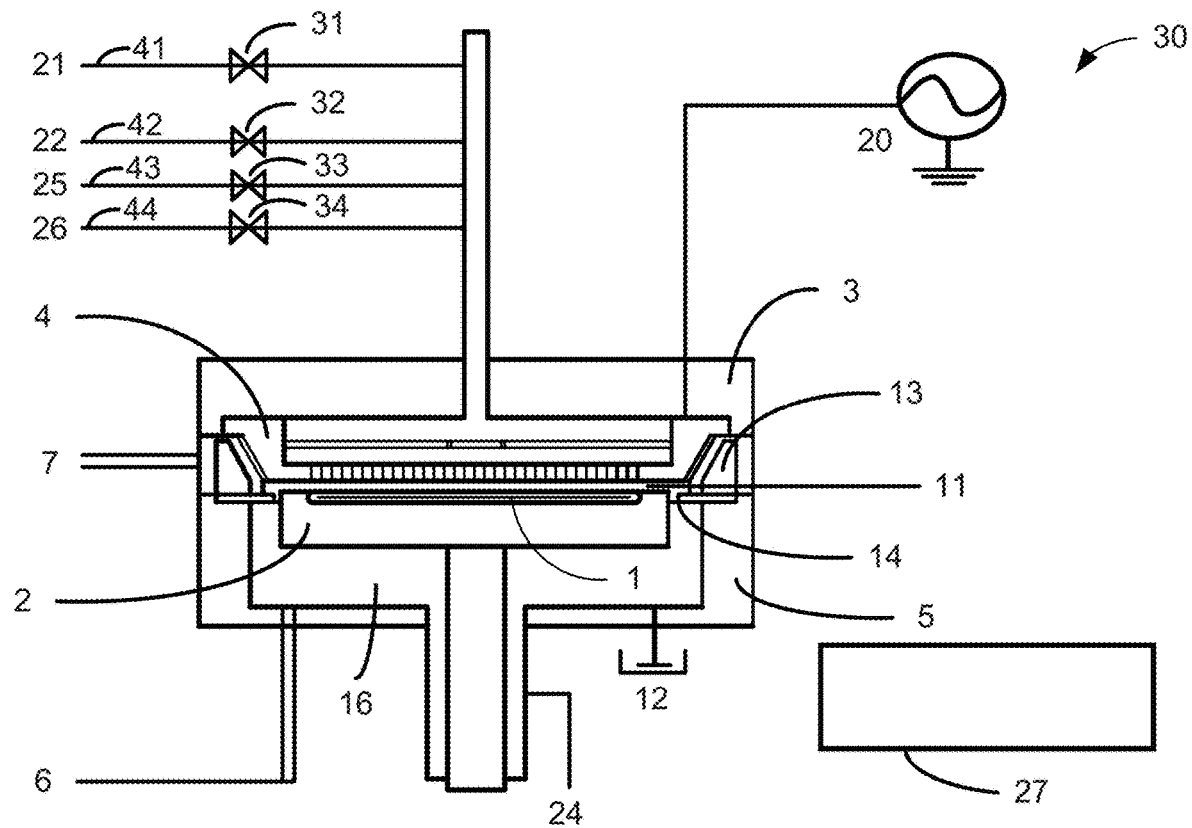
FIG. 3A illustrates schematic representation of a PEALD (plasma-enhanced atomic layer deposition) apparatus suitable for filling a recess in accordance with at least one embodiment of the present disclosure.
Figure 3B:
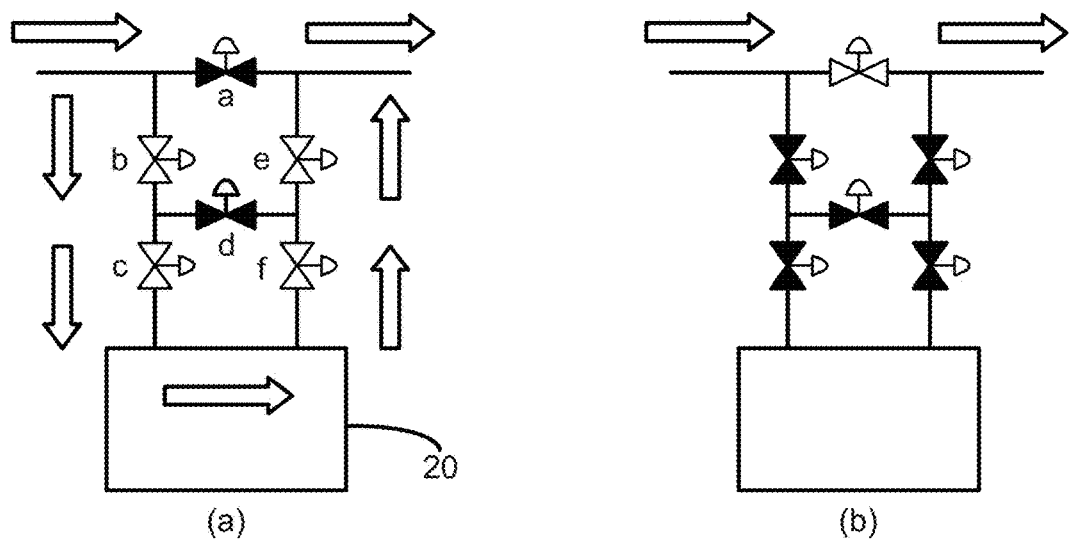
FIG. 3B illustrates a schematic representation of a precursor supply system using a flow-pass system (FPS) usable in accordance with at least one embodiment of the present disclosure.

FIG. 3A and FIG. 3B illustrate a semiconductor processing apparatus 30 in accordance with exemplary embodiments of the disclosure. Semiconductor processing apparatus 30 includes one or more reaction chambers 3 for accommodating a substrate comprising a surface having a recess formed therein; a first source 21 for a first reactant in gas communication via a first valve 31 with one of the reaction chambers; a second source 22 for a second reactant in gas communication via a second valve 32 with one of the reaction chambers; a third source 25 for a third reactant in gas communication via a third valve 33 with one of the reaction chambers; an optional fourth source 26 (e.g., for a purge or carrier gas) in gas communication via a fourth valve 34 with one of the reaction chambers; and a controller 27 operably connected to the first, second, third, and optionally fourth gas valves and configured and programmed to control: introducing the first reactant for a first pulse time to the substrate; introducing the second reactant for a second pulse time to the substrate; and introducing the third reactant for a third pulse time to the substrate. In accordance with exemplary aspects, the controller is configured, such that the first pulse time is greater than the third pulse time. In accordance with further aspects, an anisotropic plasma is provided during the step of introducing the first reactant. An isotropic plasma can be provided to the recess/substrate surface during the step of introducing the third reactant. The fourth gas can be introduced with any of the first, second, and/or third reactants, and/or can be used as a purge gas as described herein. Although not illustrated, semiconductor processing apparatus 30 can include additional sources and additional components, such as those typically found on semiconductor processing apparatus.

Optionally, semiconductor processing apparatus 30 is provided with a heater to activate the reactions by elevating the temperature of one or more of the substrate, the first, second and third reactants. Exemplary single wafer reactors, designed specifically to perform cyclic or ALD processes, are commercially available from ASM International NV (Almere, The Netherlands) under the tradenames Pulsar®, Emerald®, Dragon® and Eagle®. Exemplary batch ALD reactors, designed specifically to perform ALD processes, are also commercially available from ASM International NV under the tradenames A400™ and A412™.

Semiconductor processing apparatus 30 may be provided with a radiofrequency source operably connected with the controller constructed and arranged to produce a plasma of the first, second and/or third reactant. The plasma enhanced atomic layer deposition (PEALD) may be performed in an Eagle® XP8 PEALD reactor available from ASM International NV of Almere, the Netherlands which apparatus comprises a plasma source to activate one or more of the reactants.

The process cycle with a plasma may be performed using semiconductor processing apparatus desirably in conjunction with controls programmed to conduct the sequences described herein, usable in at least some embodiments of the present disclosure. In the apparatus illustrated in FIG. 3A, by providing a pair of electrically conductive flat-plate electrodes 4, 2 in parallel and facing each other in the interior 11 (reaction zone) of reaction chamber 3, applying RF power (e.g., 13.56 MHz or 27 MHz) from a power source 20 to one side, and electrically grounding the other side 12, a plasma is excited between the electrodes.

A temperature regulator can be provided in a lower stage 2 (the lower electrode), and a temperature of substrate 1 placed thereon can be kept at a relatively constant temperature. The upper electrode 4 can serve as a shower plate as well, and reactant gas (and optionally an inert gas, such as a noble gas) and/or purge gasses can be introduced into the reaction chamber 3 through gas lines 41-44, respectively, and through the shower plate 4.

Additionally, in the reaction chamber 3, a circular duct 13 with an exhaust line 7 is provided, through which gas in the interior 11 of the reaction chamber 3 is exhausted. Additionally, a transfer chamber 5—e.g., disposed below the reaction chamber 3—is provided with a seal gas line 24 to introduce seal gas into the interior 11 of the reaction chamber 3 via the interior 16 (transfer zone) of the transfer chamber 5, wherein a separation plate 14 for separating the reaction zone and the transfer zone is provided (a gate valve through which a wafer is transferred into or from the transfer chamber 5 is omitted from this figure). The transfer chamber is also provided with an exhaust line 6. In some embodiments, the deposition of a multi-element film and a surface treatment (e.g., steps 104-108) are performed in the same reaction space, so that all the steps can continuously be conducted without exposing the substrate to air or other oxygen-containing atmosphere. In some embodiments, a remote plasma unit can be used for exciting a gas—e.g., from one or more of sources 21, 22, 25, and/or 26.

In some embodiments, in the apparatus depicted in FIG. 3A, a system of switching flow of an inactive gas and flow of a precursor or reactant gas is illustrated in FIG. 3B; this system can be used to introduce the precursor or reactant gas in pulses without substantially fluctuating pressure of the reaction chamber. FIG. 3B illustrates a precursor supply system using a flow-pass system (FPS) according to an embodiment of the present disclosure (black valves indicate that the valves are closed). As shown in (a) in FIG. 3B, when feeding a precursor to a reaction chamber (not shown), first, a carrier gas such as Ar (or He) flows through a gas line with valves b and c, and then enters a bottle (reservoir) 20. The carrier gas flows out from the bottle 20 while carrying a precursor gas in an amount corresponding to a vapor pressure inside the bottle 20 and flows through a gas line with valves f and e, and is then fed to the reaction chamber together with the precursor. In this case, valves a and d are closed. When feeding only the carrier gas (e.g., noble gas) to the reaction chamber, as shown in (b) in FIG. 3B, the carrier gas flows through the gas line with the valve while bypassing the bottle 20. In this case, valves b, c, d, e, and f are closed. A reactant may be provided with the aid of a carrier gas.

A plasma for deposition may be generated in situ, for example, in a gas that flows continuously throughout the deposition cycle. In other embodiments, the plasma may be generated remotely and provided to the reaction chamber.

In some embodiments, a dual chamber reactor (two sections or compartments for processing wafers disposed closely to each other) can be used, wherein a reactant gas and an inert gas, such as a noble gas, can be supplied through a shared line, whereas a precursor gas can be supplied through unshared lines.

An apparatus can include one or more controller(s), such as controller 27, programmed or otherwise configured to cause the deposition processes described herein to be conducted. The controller(s) can be communicated with the various power sources, heating systems, pumps, robotics, and gas flow controllers or valves of the reactor.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub-combinations of the various processes, systems, and configurations, and other features, functions, acts, and/or properties disclosed herein, as well as any and all equivalents thereof.

What is claimed is:

1. A semiconductor processing apparatus comprising:
   one or more reaction chambers for accommodating a substrate comprising a surface having a recess formed therein;
   a first source for a first reactant in gas communication via a first valve with one of the reaction chambers;
   a second source for a second reactant in gas communication via a second valve with one of the reaction chambers; and
   a controller operably connected to the first and the second gas valves and configured and programmed to control:
      introducing the first reactant for a first pulse time to the substrate at a first pressure to provide an anisotropic plasma to a first portion of a surface of at a top the recess relative to a bottom of the recess;
      introducing the second reactant for a second pulse time to the substrate
      introducing a third reactant, wherein the third reactant comprises oxygen,
   wherein an isotropic plasma is formed during the step of introducing a third reactant.

2. The semiconductor processing apparatus of claim 1, wherein at least one of the one or more reaction chambers comprises a direct plasma atomic layer deposition reaction chamber.

3. A method comprising:
   providing the semiconductor apparatus comprising:
      one or more reaction chambers for accommodating a substrate comprising a surface having a recess formed therein;
      a first source for a first reactant in gas communication via a first valve with one of the reaction chambers;
      a second source for a second reactant in gas communication via a second valve with one of the reaction chambers; and
      a controller operably connected to the first and the second gas valves and configured and programmed to control:
      providing a substrate in the reaction chamber;
      introducing the first reactant, to form first active species using the anisotropic plasma, for the first pulse time to the substrate at the first pressure, wherein the first active species modify the first portion of a surface at the top of the recess;
      introducing the second reactant for the second pulse time to the substrate, wherein the second reactant reacts with a second portion of the surface at a bottom of the recess to form chemisorbed material on the second portion of the recess; and
introducing a third reactant, wherein the third reactant comprises oxygen,
wherein an isotropic plasma is formed during the step of introducing a third reactant.

\* \* \* \* \*